United States Patent
Tan et al.

(10) Patent No.: US 9,490,423 B2
(45) Date of Patent: Nov. 8, 2016

(54) INTEGRATED CIRCUIT STRUCTURES WITH SPIN TORQUE TRANSFER MAGNETIC RANDOM ACCESS MEMORY ULTILIZING ALUMINUM METALLIZATION LAYERS AND METHODS FOR FABRICATING THE SAME

(71) Applicant: GLOBALFOUNDRIES Singapore Pte. Ltd., Singapore (SG)

(72) Inventors: Juan Boon Tan, Singapore (SG); Wanbing Yi, Singapore (SG); Danny Pak-Chum Shum, Singpaore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 10 days.

(21) Appl. No.: 14/537,955

(22) Filed: Nov. 11, 2014

(65) Prior Publication Data

US 2016/0133830 A1    May 12, 2016

(51) Int. Cl.
| | |
|---|---|
| *H01L 43/12* | (2006.01) |
| *H01L 43/02* | (2006.01) |
| *H01L 43/08* | (2006.01) |
| *H01L 43/10* | (2006.01) |
| *G11C 11/15* | (2006.01) |
| *G11C 11/16* | (2006.01) |
| *H01L 27/22* | (2006.01) |

(52) U.S. Cl.
CPC ............ *H01L 43/12* (2013.01); *H01L 43/02* (2013.01); *H01L 43/08* (2013.01); *H01L 43/10* (2013.01); *G11C 11/15* (2013.01); *G11C 11/16* (2013.01); *H01L 27/222* (2013.01)

(58) Field of Classification Search
CPC combination set(s) only.
See application file for complete search history.

(56) References Cited

U.S. PATENT DOCUMENTS

| | | | |
|---|---|---|---|
| 6,611,453 B2 | 8/2003 | Ning | |
| 7,001,783 B2 | 2/2006 | Costrini et al. | |
| 2002/0167090 A1* | 11/2002 | Hsue | H01L 21/76807 257/762 |
| 2003/0164529 A1* | 9/2003 | Inoue | H03H 9/02929 257/414 |
| 2006/0054947 A1* | 3/2006 | Asao | H01L 43/12 257/295 |
| 2014/0087483 A1 | 3/2014 | Ohsawa et al. | |
| 2014/0269033 A1* | 9/2014 | Natori | H01L 43/08 365/158 |

* cited by examiner

*Primary Examiner* — Mohammad Islam
*Assistant Examiner* — Ratisha Mehta
(74) *Attorney, Agent, or Firm* — Lorenz & Kopf, LLP

(57) ABSTRACT

STT-MRAM integrated circuits employing aluminum metallization layers and methods for fabricating the same are disclosed. A method for fabricating an integrated circuit includes forming a first metallization layer including an aluminum material, forming a magnetic tunnel junction (MTJ) structure over the first metallization layer, and forming an encapsulation layer over the MTJ structure and over the first metallization layer. The method further includes etching the encapsulation layer and the first metallization layer to form an encapsulation segment overlying a first metal line, forming a contact plug to the MTJ structure, and forming a second metal line including an aluminum material over the contact plug.

10 Claims, 3 Drawing Sheets

INTEGRATED CIRCUIT STRUCTURES WITH SPIN TORQUE TRANSFER MAGNETIC RANDOM ACCESS MEMORY ULTILIZING ALUMINUM METALLIZATION LAYERS AND METHODS FOR FABRICATING THE SAME

TECHNICAL FIELD

The present disclosure generally relates to integrated circuits and methods for fabricating integrated circuits. More particularly, the present disclosure relates to spin torque transfer magnetic random access memory (STT-MRAM) structures in integrated circuits utilizing aluminum metallization layers and methods for fabricating the same.

BACKGROUND

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though conventional non-volatile RAM is typically slower than volatile RAM, MRAM has read and write response times that are comparable to that of volatile RAM. Unlike typical RAM technologies that store data as electric charges, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and is susceptible to write disturbances. The programming current employed to switch between higher and lower electrical resistance states across the MRAM magnetic layers is typically high. Thus, when multiple cells are arranged in an MRAM array, the programming current directed to one memory cell may induce a field change in the free layer of an adjacent cell. This potential for write disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ). An MTJ is a magnetoresistive data storing element including two magnetic layers (one pinned and one free) and an insulating layer in between the two magnetic layers, a bit line, a word line, a source line, and an access transistor. A programming current typically flows through the access transistor and the magnetic cell stack. The pinned layer polarizes the electron spin of the programming current, and torque is created as the spin-polarized current passes through the stack. The spin-polarized electron current interacts with the free layer by exerting a torque on the free layer. When the torque of the spin-polarized electron current passing through the stack is greater than the critical switching current density ($J_C$), the torque exerted by the spin-polarized electron current is sufficient to switch the magnetization of the free layer. Thus, the magnetization of the free layer can be aligned to be either parallel or antiparallel to the pinned layer to change the resistance state across the stack.

The STT-MRAM has advantageous characteristics over the conventional MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between higher and lower electrical resistance states, thereby improving read operations in the magnetic domain.

Presently-known STT-MRAM structures and methods for fabricating such structures all suffer from several drawbacks. For example, a disadvantage of manufacturing STT-MRAMs is that copper is currently the preferred material for the metallization layers or conductive lines used for interconnecting the STT-MRAM structures, due to the excellent conductive properties of copper compared to aluminum and other conventional metals used in semiconductor technology. However, disadvantageously, copper oxidizes easily, and additional processing steps are required in order to prevent oxidation. Furthermore, copper cannot be etched in the current MTJ flow scheme, and therefore, damascene processes must be used to form copper conductive lines. Misalignment is a frequent problem with damascene processes, which is particularly problematic in the manufacturing of STT-MRAM devices.

Accordingly, it is desirable to provide robust and reliable STT-MRAM structures. Additionally, it is desirable to provide methods for the fabrication of such structures that are easily integrated into existing process flow schemes used in semiconductor fabrication facilities. Still further, it is desirable to provide such structures and methods that avoid the use of copper and the damascene processes associated therewith that are known to cause misalignment problems. Furthermore, other desirable features and characteristics of the present disclosure will become apparent from the subsequent detailed description and the appended claims, taken in conjunction with the accompanying drawings and the foregoing technical field and background.

BRIEF SUMMARY

Spin torque transfer magnetic random access memory in integrated circuits and methods for fabricating the same are disclosed. In one exemplary embodiment, a method of fabricating an integrated circuit includes forming a first interlayer dielectric (ILD) layer and forming a first metallization layer over the first ILD layer. The first metallization layer includes an aluminum material. The method further includes forming a magnetic tunnel junction (MTJ) structure over the first metallization layer that is in physical and electrical contact with the first metallization layer, forming an encapsulation layer over the MTJ structure and over the first metallization layer, and etching the encapsulation layer and the first metallization layer to form an encapsulation segment overlying a first metal line. Both the encapsulation segment and the first metal line have dimensions that are greater than dimensions of the MTJ structure. The method further includes forming a second ILD layer over the first ILD layer and the encapsulation segment and forming a contact hole within the second ILD layer and the encapsulation segment to expose a portion of the MTJ structure. The contact hole has dimensions that are smaller than the dimensions of the MTJ structure. Still further, the method includes forming a contact plug within the contact hole in physical and electrical contact with the MTJ structure and forming a second metal line over the second ILD layer and the contact plug in physical and electrical contact with the contact plug, wherein the second metal line includes an aluminum material.

In another exemplary embodiment, an integrated circuit structure includes a first interlayer dielectric (ILD) layer and a first metal line over the first ILD layer. The first metal line layer includes an aluminum material. The integrated circuit structure further includes a magnetic tunnel junction (MTJ) structure over the first metal line that is in physical and electrical contact with the first metal line and an encapsulation segment over the MTJ structure and over the first metal line. Both the encapsulation segment and the first metal line have dimensions that are greater than dimensions of the MTJ structure. The integrated circuit structure further includes a second ILD layer over the first ILD layer and the encapsulation segment and a contact plug in physical and electrical contact with MTJ structure. The contact plug has dimensions that are smaller than the dimensions of the MTJ structure. Still further, the integrated circuit structure includes a second metal line over the second ILD layer and the contact plug in physical and electrical contact with the contact plug. The second metal line includes an aluminum material.

In yet another exemplary embodiment, a method for fabricating an integrated circuit includes forming a first metallization layer including an aluminum material, forming a magnetic tunnel junction (MTJ) structure over the first metallization layer, and forming an encapsulation layer over the MTJ structure and over the first metallization layer. The method further includes etching the encapsulation layer and the first metallization layer to form an encapsulation segment overlying a first metal line, forming a contact plug to the MTJ structure, and forming a second metal line including an aluminum material over the contact plug.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present disclosure will hereinafter be described in conjunction with the following drawing figures, wherein like numerals denote like elements, and wherein.

DETAILED DESCRIPTION

Figure 1:
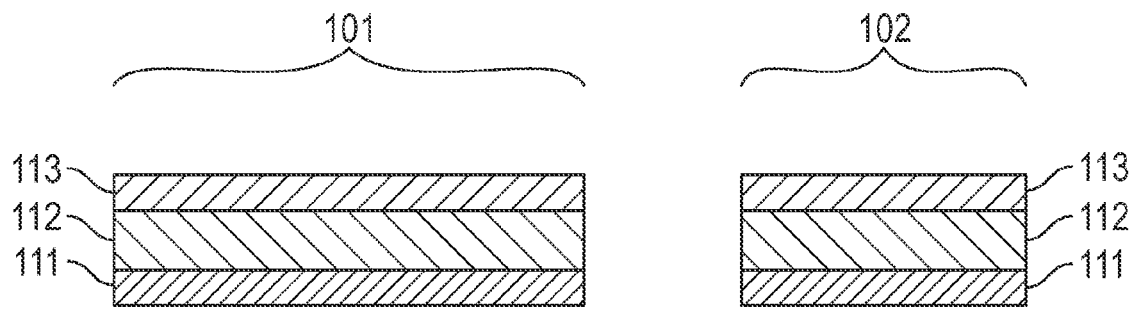
FIGS. 1-9 illustrate, in cross section, STT-MRAM structures and methods for fabricating STT-MRAM integrated circuits in accordance with various embodiments of the present disclosure.

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to spin torque transfer magnetic random access memory (STT-MRAM) integrated circuit structures that employ aluminum metallization layers and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As used herein, it will be understood that when an element or layer, such as an STT-MRAM element or an aluminum metallization layer, is referred to as being "on," "connected to" or "coupled to" another element or layer, it may be directly on, connected to, or coupled to the other element or layer, or intervening elements or layers may be present. Further, spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the STT-MRAM device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

FIGS. 1-9 illustrate, in cross-section, STT-MRAM structures and methods for fabricating STT-MRAM integrated circuits in accordance with various embodiments of the present disclosure. The presently described processes, although focused primarily on the fabrication of memory devices, are also compatible with logic devices as well. Accordingly, for completeness of disclosure, each of FIGS. 1-9 illustrate a memory portion 101 of the integrated circuit structure, wherein the STT-MRAM is to be formed, and a logic portion 102 of the integrated circuit structure, wherein memory is not formed.

With attention first to FIG. 1, the cross-sectional view illustrates an inter-layer dielectric (ILD) layer 111 in both portions 101 and 102. The ILD layer 111 may be formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The ILD layer 111 may be formed using conventional deposition techniques, which depend on the particular material employed. In an exemplary embodiment, the ILD layer 111 includes silicon dioxide and may be formed by means of a CVD process or a plasma-enhanced CVD process in which tetraethyl orthosilicate (TEOS) is used as a reactant. Though not illustrated for simplicity in the Figures, the ILD layer 111 may be formed over an active region of a semiconductor substrate forming part of the integrated circuit structure. As such, the semiconductor substrate may include a plurality of isolation features (not shown), such as shallow trench isolation (STI) features or local oxidation of silicon (LOCOS) features. The isolation features may define and isolate the various microelectronic elements (not shown), also referred to herein as the aforesaid active regions. Examples of the various microelectronic elements that may be formed in the substrate include transistors (e.g., metal oxide semiconductor field effect transistors (MOSFET) and bipolar junction transistors (BJT)), and/or other suitable elements. These microelectronic elements may be used as a selector device for an exemplary STT-MRAM cell, as is known in the art.

The partially-formed integrated circuit structure illustrated in FIG. 1 may also include a first metallization layer 112 in both portions 101 and 102. In the prior art, copper damascene conductive lines have been used in STT-MRAM back-end-of-line processes because of the high conductivity and low resistivity of copper. Because aluminum has a higher sheet resistance than copper, it has not been considered in the past to be a viable option for use in conductive lines of STT-MRAMs. However, recently developed aluminum technology is capable of processing smaller aluminum lines with higher aspect ratios. These technologies provide aluminum with a sheet resistance low enough for an STT-MRAM application, in accordance with the present disclosure, to be described further herein. As such, first metallization layer 112 is formed of an aluminum material. As used herein, the term aluminum material may refer to a metal that is entirely comprised of aluminum, or, more typically, a material that includes aluminum as its majority constituent. For instance, an exemplary aluminum material is an alloy that includes from about 95.0% to about 99.9% aluminum and about 5.0% to about 0.1% copper, such as about 99.5% aluminum and about 0.5% copper. The first metallization layer 112 may be deposited using conventional deposition techniques, such as physical vapor deposition (PVD), for example, to a thickness of about 2000 to about 5000 Angstroms.

With continued reference to FIG. 1, formed over the first metallization layer 112 in both portions 101 and 102 is a magnetic tunnel junction (MTJ) "stack" layer 113 that itself includes a plurality of individual material layers, as described below. In one embodiment, MTJ stack layer 113 includes a pinned or fixed layer, a thin (i.e., from about 1 to about 2 nm in thickness) oxide layer as a barrier layer (such as silicon oxide or magnesium oxide, for example), and a free layer (these layers of the MTJ stack are not separately illustrated for ease of illustration). The fixed layer of the STT-MRAM structure is formed (deposited) over an upper surface of the first metallization layer 112. In an exemplary embodiment, the fixed layer is formed of a platinum manganese (PtMn), iridium manganese (IrMn), nickel manganese (NiMn), or iron manganese (FeMn) material, and may include CoFeB. The free layer may be formed of CoFeB, for example. Other possible MTJ stack configurations are known in the art, and may be suitable for use herewith.

Figure 2:
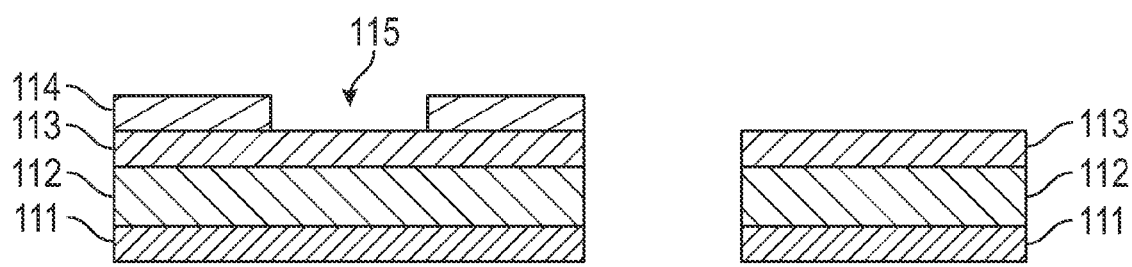
Figure 3:
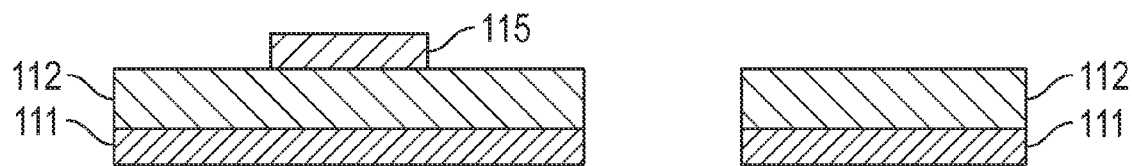

Turning now to FIG. 2, the method continues with the patterning of MTJ stack layer 113 in portion 101 only, using known photolithographic patterning and etching procedures. That is, a photoresist layer 114 is deposited over the MTJ stack layer 113 and then is exposed to an image pattern and treated with a developing solution to form a pattern opening 115 within the photoresist layer 114. With the photoresist layer 114 thus patterned, the deposited MTJ layer 113 may be etched to form an MTJ structure 116, for example using any conventional etching technique such as wet or dry etching, as shown in FIG. 3. The MTJ structure 116 is thus provided in direct physical and electrical contact with the first metallization layer 112. An entirety of the MTJ stack layer 113 may be etched away from the logic portion 102 during this process, thus re-exposing the first metallization layer 112 therein. Additionally, in the memory portion 101, portions of the first metallization layer 112 are re-exposed as well.

Figure 4:
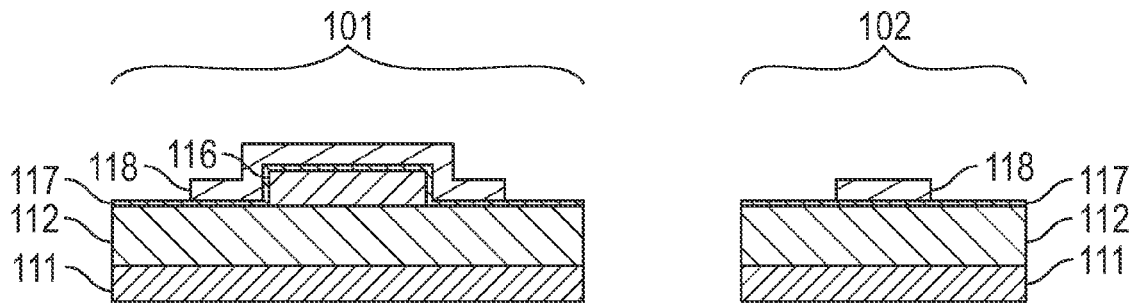

As indicated in FIG. 4, the exemplary method continues by depositing a layer 117 of an encapsulation material overlying the MTJ structure 116 and the first metallization layer 112 in memory portion 101, and overlying the first metallization layer 112 in the logic portion 102. In an exemplary embodiment, the encapsulation material includes silicon nitride or silicon dioxide. Further, an additional photoresist material layer 118 is deposited and patterned over the encapsulation layer 117 in both portions 101 and 102. The additional photoresist material layer 118 is patterned in portion 101 so as to be disposed at least over the MTJ element 116 and also portions of the first metallization layer 112 adjacent thereto, and the additional photoresist material layer 118 is patterned in portion 102 to overlie some, but not all, of the first metallization layer 112.

Figure 5:
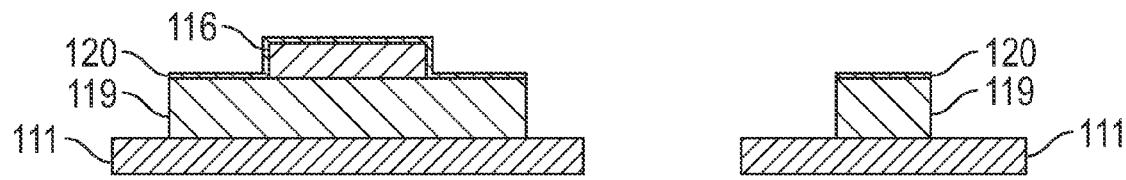

Thereafter, with attention now to FIG. 5, the portions of the encapsulation layer 117 and the first metallization layer 112 that are not covered by the additional photoresist material layer 118 may be etched away using any conventional etching technique such as wet or dry etching. The etching may be performed in one or more steps so as to ensure appropriate selectivity toward the encapsulation layer 117 and the first metallization layer 112, while avoiding etching the ILD layer 111 below the first metallization layer 112. What remains after etching are first metal lines 119 that are covered by encapsulation segments 120 in both portions 101 and 102. In memory portion 101, the encapsulation segment 120 also covers the MTJ structure 116. As shown, the patterning and etching of first metallization layer 112 is performed in portion 101 so as to leave the MTJ structure 116 disposed over the resulting first metal line 119, wherein the first metal line 119 has greater lateral dimensions than the MTJ structure 116.

Figure 6:
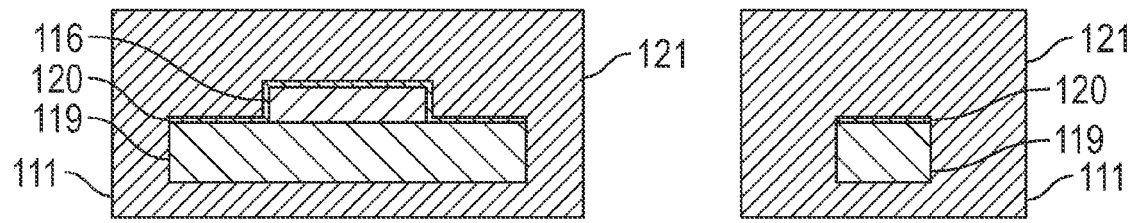

Continuing the discussion of the exemplary method with reference now to FIG. 6, a further ILD layer 121 is deposited in both portions 101 and 102, including over the ILD layer 111 and the encapsulation segments 120. The further ILD layer 121 may be formed of one or more low-k dielectric materials, un-doped silicate glass (USG), silicon nitride, silicon oxynitride, or other commonly used materials. The further ILD layer 121 may be formed using conventional deposition techniques, which depend on the particular material employed. In an exemplary embodiment, the further ILD layer 121 includes silicon dioxide and may be formed by means of a CVD process or a plasma-enhanced CVD process in which tetraethyl orthosilicate (TEOS) is used as a reactant. In some embodiments, chemical mechanical planarization (CMP) procedures may be performed on the deposited further ILD layer 121.

Figure 7:
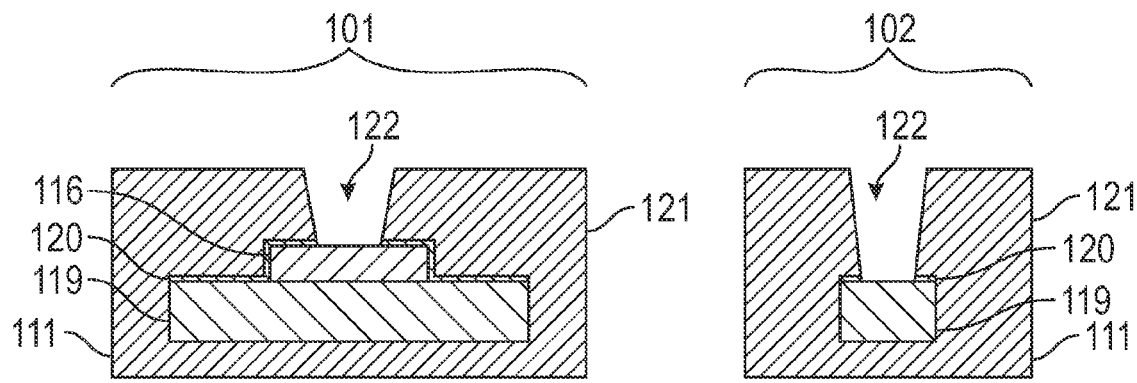

FIG. 7 illustrates the formation of contact holes 122 to the MTJ structure 116 in portion 101 and to the first metal line 119 in portion 102. Contact holes 122 may be formed by photolithographic patterning and etching procedures. That is, a photoresist layer (not illustrated) is deposited over the further ILD layer 121 and then is exposed to an image pattern and treated with a developing solution to form a pattern opening within the photoresist layer. With the photoresist layer thus patterned, the ILD layer 121 and the encapsulation segments 120 may be appropriately etched to form the contact holes 122, for example using any conventional etching technique such as wet or dry etching. As illustrated, the contact holes 122 have narrower dimensions than either the MTJ structure 116 in portion 101 or the first metal line 119 in portion 102 to which the contact holes 122 extend, i.e., there is at least one unexposed portion of the MTJ structure 116 adjacent the portion of the MTJ structure 116 exposed by the contact hole 122.

Figure 8:
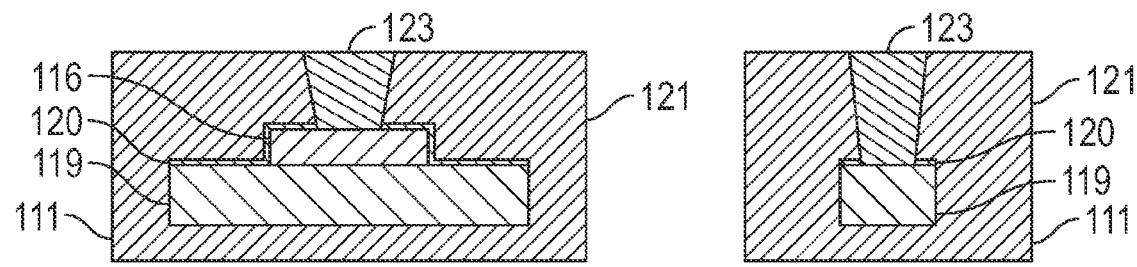

FIG. 8 illustrates the formation of contact structures or "plugs" 123 within the contact holes 122 in both portions 101 and 102. The contact plugs 123 may be formed by depositing a tungsten-based metal. The plugs 123 are formed in direct physical and electrical contact with the MTJ structure 116 in portion 101, and with the first metal line 119 in portion 102. The contact plugs 123 may further include an appropriate barrier layer system. Formation of the contact plugs 123 may be accomplished on the basis of a sputter deposition technique, for instance, for the barrier materials, and chemical vapor deposition (CVD)-like process recipes for forming the tungsten material. The contact plugs 123 are then planarized so as to be substantially co-planar with the upper surface of the further ILD layer 121, for example using CMP procedures.

Figure 9:
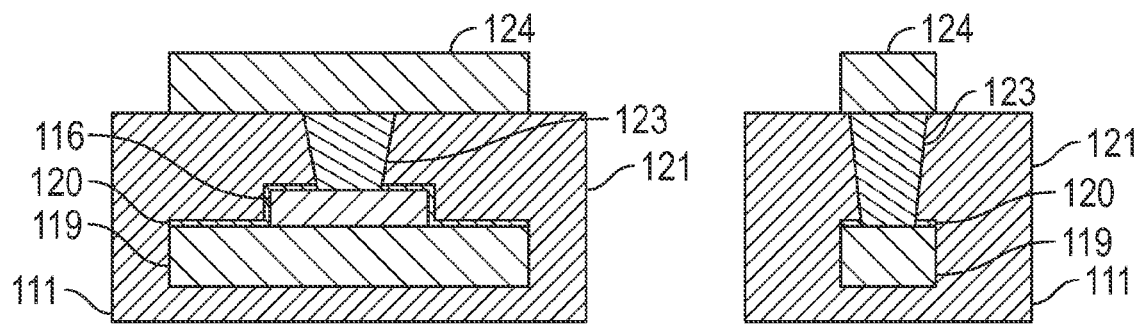

Further, as illustrated with respect to FIG. 9, a second metallization layer is deposited and patterned to form second metal lines 124 that overlie the contact plugs 123, and are in direct physical and electrical contact with such plugs 123. That is, a photoresist layer (not illustrated) is deposited over the further second metallization layer and then is exposed to an image pattern and treated with a developing solution to form a pattern opening within the photoresist layer. With the photoresist layer thus patterned, the second metallization layer may be appropriately etched to form the second metal lines 124, for example using any conventional etching technique such as wet or dry etching. As illustrated, the second metal lines 124 in both portions 101 and 102 have greater dimensions than either of the contact plugs 123 with which the second metal lines 124 are in contact. The second metal lines 124 are formed of an aluminum material, as with the first metal lines. Again, the term aluminum material may refer to a metal that is entirely comprised of aluminum, or, more typically, a material that includes aluminum as its majority constituent. The second metallization layer that forms the second metal lines 124 may be deposited using conventional deposition techniques, such as physical vapor deposition (PVD), for example, to a thickness of about 2000 to about 5000 Angstroms.

Accordingly, disclosed herein are spin torque transfer magnetic random access memory (STT-MRAM) integrated circuit structures that employ aluminum metallization layers and methods for fabricating the same. As described above, the first and second aluminum metallization layers are able to be directly etched, thus the described methods avoid the damascene processes required for copper that may result in misalignment problems. Additionally, the STT-MRAM structures disclosed herein will be easily integrated into conventional chiplets that include multiple aluminum layers, and thus costly process modifications to accommodate the described embodiments are avoided. Still further, as illustrated in the foregoing Figures, the disclosed processes are compatible with logic portions of the integrated circuit as well, and as such the use of additional masking procedures to protect the logic features is avoided.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the structures or methods in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A method of fabricating an integrated circuit, the integrated circuit comprising a memory portion and a logic portion, the method comprising the steps of:
   forming a first interlayer dielectric (ILD) layer in both the memory portion and the logic portion simultaneously;
   forming a first metallization layer over the first ILD layer in both the memory portion and the logic portion simultaneously, wherein the first metallization layer comprises an aluminum material that includes aluminum as its majority constituent;
   forming a magnetic tunnel junction (MTJ) structure over the first metallization layer that is in physical and electrical contact with the first metallization layer in only the memory portion, wherein forming the MTJ structure comprises forming an MTJ layer in both the memory portion and the logic portion simultaneously, and thereafter etching only a portion of the MTJ layer in the memory region to form the MTJ structure while simultaneously etching away an entirety of the MTJ layer in the logic region;
   forming an encapsulation layer over the MTJ structure and over the first metallization layer in the memory portion while simultaneously forming the encapsulation layer of the first metallization layer in the logic portion;
   in the memory portion, etching the encapsulation layer and the first metallization layer to form an encapsulation segment overlying a first memory metal line, wherein both the encapsulation segment and the first memory metal line have dimensions that are greater than dimensions of the MTJ structure, while simultaneously in the logic portion, etching the encapsulation layer and the first metallization layer to form an encapsulation segment overlying a first logic metal line;
   forming a second ILD layer over the first ILD layer and the encapsulation segments of both the memory and logic portions, simultaneously;
   forming a first contact hole within the second ILD layer and the encapsulation segment in the memory portion to expose a portion of the MTJ structure, wherein the first contact hole has dimensions that are smaller than the dimensions of the MTJ structure, and simultaneously forming a second contact hole within the second ILD layer and the encapsulation segment in the logic portion to expose a portion of the first logic metal line;
   forming a first contact plug within the first contact hole in physical and electrical contact with the MTJ structure in the memory portion, and simultaneously forming a second contact plug within the second contact hole in physical and electrical contact with the first logic metal line; and
   forming a second memory metal line over the second ILD layer and the first contact plug in physical and electrical contact with the first contact plug and simultaneously forming a second logic metal line over the second ILD layer and the second contact plug in physical and electrical contact with the second contact plug, wherein the first and second memory metal lines comprise an aluminum material that includes aluminum as its majority constituent, wherein:

the first and second memory metals lines, and the first and second logic metal lines, respectively, are formed on-axis with regard to one another, and the method excludes the use of damascene processes in the formation of the first and second memory metal lines and the first and second logic metal lines.

2. The method of claim 1, wherein forming the MTJ layer comprises forming a fixed layer, a barrier layer, and a free layer.

3. The method of claim 1, wherein forming the encapsulation layer comprises forming a silicon nitride layer.

4. The method of claim 1, wherein forming the first ILD layer comprises forming a silicon oxide layer.

5. The method of claim 1, wherein forming the first metallization layer comprises forming a layer of a metal alloy that comprises about 95.0% to about 99.9% aluminum and about 5.0% to about 0.1% copper.

6. The method of claim 1, wherein forming the first and second contact plugs comprises depositing a tungsten material into the first and second contact holes.

7. The method of claim 6, wherein forming the first and second contact plugs further comprises depositing a barrier material into the first and second contact holes.

8. The method of claim 1, wherein forming the second ILD layer comprises forming a silicon oxide layer.

9. The method of claim 1, wherein forming the second metallization layer comprises forming a layer of a metal alloy that comprises about 95.0% to about 99.9% aluminum and about 5.0% to about 0.1% copper.

10. The method of claim 1, wherein forming the first ILD layer comprises forming the first ILD layer over a semiconductor substrate comprising an active integrated circuit element.

* * * * *